Nov. 25, 1969 J. ARONSTEIN 3,480,836

COMPONENT MOUNTED IN A PRINTED CIRCUIT

Filed Aug. 11, 1966 3 Sheets-Sheet 1

INVENTOR
JESSE ARONSTEIN

BY Harry Powers

ATTORNEY

United States Patent Office 3,480,836
Patented Nov. 25, 1969

3,480,836

COMPONENT MOUNTED IN A PRINTED CIRCUIT

Jesse Aronstein, Poughkeepsie, N.Y., assignor to International Business Machines Corporation, Armonk, N.Y., a corporation of New York Filed Aug. 11, 1966, Ser. No. 571,812
Int. Cl. H05k *1/10*
U.S. Cl. 317—100 10 Claims

ABSTRACT OF THE DISCLOSURE

A mounting configuration for electrical components in which the components are mounted in preformed holes provided in a circuit board which is designed to include conductor leads having projecting tabs overlying the holes. The projecting tabs have an end portion concavely bent out of the plane of the board, and the distal portion of the tab is soldered or welded to a terminal of the component mounted in the hole. Such a formed tab permits thermal expansion strains and mechanical strains to be taken up in its bent portion.

This invention relates to printed circuitry and more particularly to the interconnection of circuit components to printed circuits.

In the manufacture of printed circuit assemblies, various means have been proposed to reduce the volume occupied by printed circuits and their associated components connected thereto. A particularly effective method comprises the insertion of various components of holes or cavities in a printed circuit board followed by interconnecting the components to the printed circuit. Typical methods of such mounting and interconnection of components to printed circuit boards and the problems associated therewith are described in U.S. Patents 2,869,041; 3,142,-783; 3,192,307; and 3,258,898, and on pages 159 to 164 of the text "Microelectronics," E. Keonjian, 1963, McGraw-Hill Co. The previous methods proposed for such interconnection between a printed circuit and a component mounted in a cavity of the printed circuit board have heretofore required the use of intermediate conductors which require two bonds per lead involving lower reliability or yield and/or result in rigid connected assemblies which, although electrically satisfactory, necessarily involve a lack of mechanical stability when the assembly is subjected to mechanical and thermal stresses.

Accordingly, it is an object of this invention to eliminate disadvantages of the prior art.

Another object of this invention is to provide a novel method for interconnecting circuit components to a printed circuit board.

A further object of this invention is a novel method for incorporating circuit components with a printed circuit board which provides a compact interconnected assembly.

A still further object of this invention is to provide a novel means for direct connects of a component to a printed circuit pattern into an assembly having improved mechanical stability.

The foregoing and other objects, features and advantages of the invention will be apparent from the following more particular description of the preferred embodiments of the invention as illustrated in the accompanying drawings in which.

Figure 1:
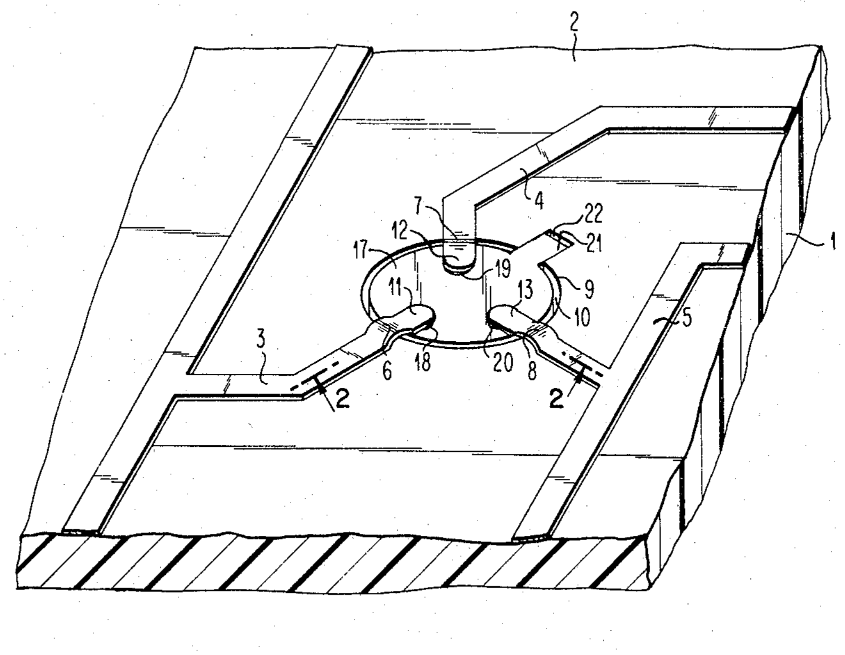
FIGURE 1 shows a perspective view of one embodiment of the invention.

Generally speaking, the invention comprehends an electrical assembly comprised of an electrically non-conductive supporting panel provided with a component receiving hole or cavity and a printed circuit pattern on a surface of the panel, wherein the circuit pattern includes at least one metallurgically integral conductive strip or lead portion extending and projecting over the hole in cantilevered relationship therewith. In accordance with this invention, an intermediate portion of the conductive strip, which is disposed interjacent a distal portion of it and the adjacent periphery of the hole, is struck out or formed into a looped configuration which projects out of and away from the surface plane of the panel. This referred to distal portion of the conductive strip or lead is then bonded in electrically conducting relationship with a terminal of a component mounted within the hole or cavity of the panel. In the preferred embodiment, a circuit component such as a microminiature semiconductor or subcircuit having dimensions, for example, of .058 x .058 x .008 will generally have a planar or flat shape which is disposed within the surface planes of the printed circuit board when the component is mounted in a provided mounting hole having dimensions adapted to receive the component. Various other circuit components which may be employed with the invention include resistors, capacitors and other components having one or more electrodes or terminals which are positioned at the surface of the modified printed circuit when the components are inserted in the hole of the panel.

The method of forming the printed circuit generally comprises prepunching a non-conductive panel with a hole having dimensions and tolerances adapted to receive an electrical component which is to interconnect into a particular electric circuit. An adherent pattern of conductive material defining the desired electrical circuit is then formed on a surface of the panel, with the pattern including at least one integral conductive strip which extends to and projects over a portion of the hole. An intermediate portion of the strip which is disposed interjacent a distal portion of it and the edge of the hole, is then suitably formed, by working, shaping and the like, into a looped configuration projecting away from the plane of the panel. A circuit component is then inserted in the hole with a terminal of the component disposed adjacent the surface of the panel carrying the circuit pattern to which connection is to be made. The circuit and the component are connected together by aligning the distal portion of the conductive strip with the terminal of component, and suitably bonding them together in electrically conductive relationship as by soldering, welding, conductive adhesives, and the like.

Any of the known methods may be employed for generating a conductive pattern to define a desired circuit on the panel, as for example by etching conductive material laminated to a surface of the panel, laminating a preformed circuit to the panel and the like. A particularly effective method for preparing the circuit comprises coating a surface of the panel with a layer of an electrically conductive material, as for example with metal, such as copper and the like, and selectively removing the coating, as by photo-resist etch techniques, so as to retain a pattern of the coating which delineates the desired circuit.

Figure 2:
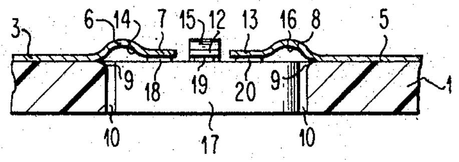
FIGURE 2 is a sectional view taken along lines 2—2 of FIGURE 1.

Referring to the drawings, FIGURES 1 and 2 show an electrical assembly illustrating the interconnection of a circuit component in accordance with this invention. In the drawings, the numeral 1 indicates a portion of a printed circuit board or panel comprised of a sheet of electrically nonconductive material which may be ceramic, plastic or other conventional insulating material.

Figure 3:
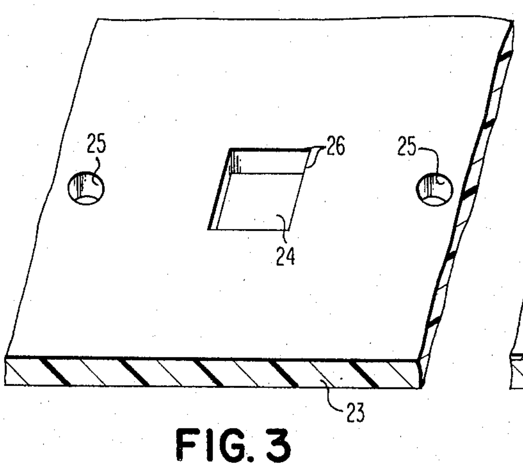
FIGURES 3 to 11 illustrate various processing steps for another embodiment of this invention and a modification thereof.
Figure 4:
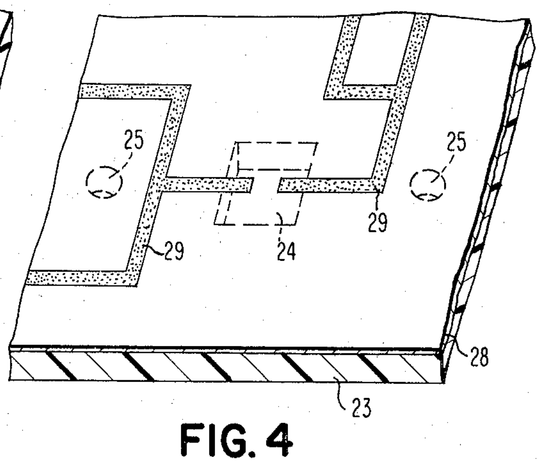

Disposed on a surface 1 of the panel are a plurality of conductive leads, 3, 4, 5, which comprise a small portion of a typical printed circuit 2, having portions which are to be connected circuit elements or components. Each of leads 3, 4 and 5 include, respectively, metallurgically integrally spaced strip portions or extensions 6, 7 and 8 which project in cantilever fashion from the periphery 9 over portions of hole 10 suitably preformed through panel 1 by punching, drilling, broaching or otherwise finished to meet required tolerances. Normally, the dimensioning of these holes will be dictated by the size of the components, number of contacts, contact spacing and the like. In general, the thickness of the circuit board or panel will preferably be about as thick as the component to be inserted in the hole. Preferably, where a connection to a terminal of a circuit component is to be made close to the edge of the component, the edges of the hole should be beveled or rounded in order to facilitate such connections in accordance with this invention. Such a rounded peripheral configuration of the hole is shown in FIGURE 3.

As shown in the drawing, the conductive strips 6, 7 and 8 have their intermediate portions, interjacent their distal portions 11, 12 and 13 and the edge 9 of hole 10, suitably shaped or formed by dies and the like, into respective looped straps 14, 15 and 16 which project out of the surface of the panel. The distal portions of the conductive strip extensions form shoulders which serve as contacts for the desired connections to a circuit component.

An electrical component 11 is then inserted in the hole 10, and suitably oriented so that its terminals 18, 19 and 20 are registered with the distal portions of the preformed conducive strip to which electrical connection is to be made, by soldering, welding, conductive adhesives and the like. If desired, the orientation of the component in the hole may be effected by means of a key 21 on the component and a keyway 22 along the side wall of the hole 10. The resultant assembly has a strain-relieving structure by virtue of the loop configuration provided by the conductive strips 6, 7 and 8 which readily accommodate mechanical and thermal stresses to which the assembly may be subjected.

A detailed step-by-step process for the fabrication of an electrical assembly in accordance with this invention is set forth in FIGURES 3 to 11 which illustrate another embodiment of this invention, and a modification therein. A circuit board 23, about as thick as the component to be employed, is prepunched with a mounting hole 24 and suitable locating holes 25 to allow the board to be precisely located during subsequent working thereon, or at a suitable station if such working is part or a step of multi-step processing line. As shown in the drawing, the hole or cavity 24 has a rectangular configuration having dimensions of .060 x .060 x .030, and the peripheral edges 26 of the opening are rounded by any suitable means.

Figure 5:
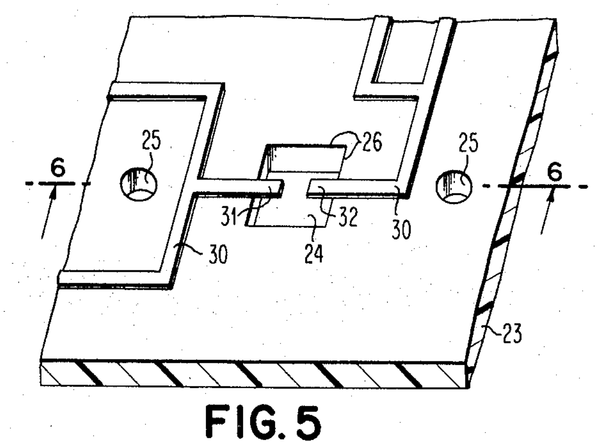
Figure 6:
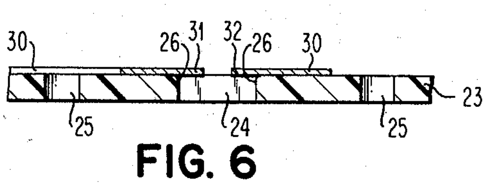

An adherent coating 28 of conductive material, such as copper and the like, is laminated to a surface 27 of the panel of adhesives, thermopressure means or other conventional methods. As will be noted, the coating 28 covers the surface of the panel and overlies mounting hole 24 and locating holes 25. The coating 28 is then provided with a layer of resist in a pattern 29 which delineates the desired electrical circuit and the bare conductive coating removed with etchants by conventional techniques. Subsequent removal of the resists provides an adherent pattern of the conductive material defining the desired circuit 30 having conductive strips or extensions 31 and 32 projecting in cantilever fashion over mounting hole 24 which is exposed by the etchant, which also exposes locating holes 25. As will be apparent, other conventional resist techniques may be employed in delineating a circuit pattern. For example, the positive or negative photoresist may be coated over the conductive coating 28 and then exposed by suitable masking techniques and processing which enables selective removal of resist and exposure of the conductive coating which is to be removed to provide a resultant circuit pattern as shown in FIGURES 5 and 6, the latter of which is taken along lines 6—6 of the preceding figure.

Figure 7:
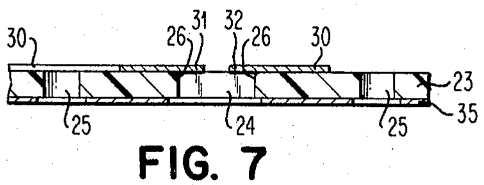

A modification of this construction is shown in FIGURE 7, in which a second electrical circuit pattern 35 of conductive material is formed by similar techniques on the opposite surface or face of panel 23. In this modification, the second circuit 35 is shown to be spaced from the periphery of the various holes 24 and 25 for the purpose of a connection to be described in a latter modification. For this reason, the modification of FIGURE 7 will be employed in the continuation of this description of the invention.

It is noted that, although the locating holes 25 have been shown to be disposed within the printed circuit area and cleared of conductive coating by etching, if desired, the locating holes may be located externally of the circuit area, or such locating holes may be prepunched in conductive cladding material which may then be laminated to the panel. Also, if desired, the panel may at this time be subjected to other processing, such as the addition of printed resistors, plating-through of holes, tinning of areas for subsequent soldering operations, etc. by any of the presently employed techniques.

Figure 8:
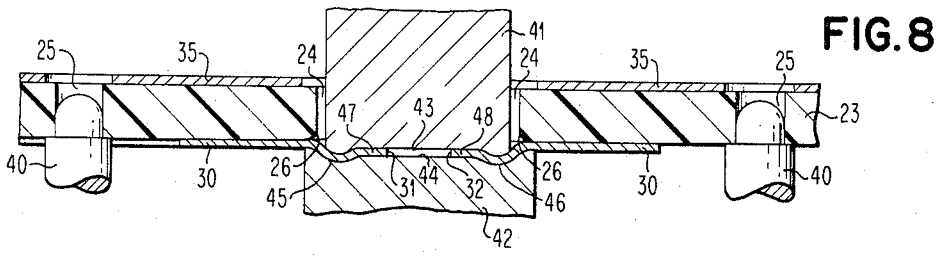
Figure 9:
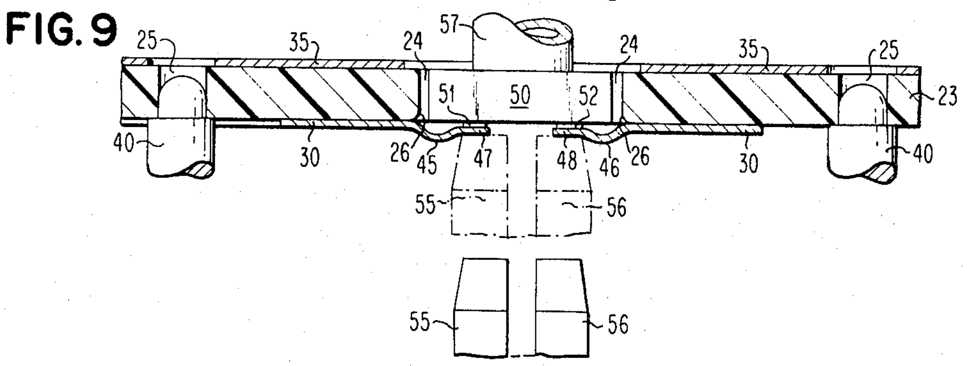

For subsequent fabrication, the circuit panel 23 is inverted, as shown in FIGURE 8, and its location holes 25 seated in locating pins 40 in order to properly orientate the panel between vertically reciprocating forming dies 41 and 42 which have complementary forming or working faces 43 and 44 for forming the conductive strips 31 and 32 into the desired looped configurations 45 and 46 in the strip portions intermediate their associated distal portions 47 and 48, and the peripheral edge 26 of mounting hole 24. As indicated above, the loops 45 and 46 will have a configuration projecting out of their associated surface of the panel in a direction generally transverse thereto. In a preferred embodiment, the formed conductive strips will also be formed so that their distal portions will project into the interior of the panel so that, upon insertion of a component in mounting hole 24, the component will abut the distal portions of the strips and depress them outwardly of the panel in order to facilitate positive contact between the distal portions and the terminals of the component.

Figure 10:
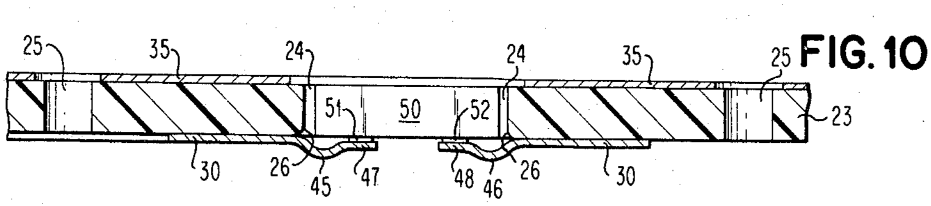

After the forming operation, an orientated component 50, such as a .008 inch thick semiconductor having a cross-sectional dimension of .058 x .058 inch is inserted in mounting hole 24 so that the component terminals 51 and 52 are properly registered with corresponding distal portions 47 and 48 to which they are bonded, as for example, by soldering tips or thermo-compression welding electrodes 55 and 56. Any conventional handling techniques may be employed for manipulating and orientating the component for insertion in mounting hole 24. A particularly effective means is a vacuum pen or pencil 57, such as described together with associated sensing and orientation mechanism in the co-pending and now abandoned Beck et al. U.S. application Ser. No. 459,379, filed May 27, 1965 and assigned to the same assignee as this application. The finished assembly is shown in FIGURE 10.

Figure 11:
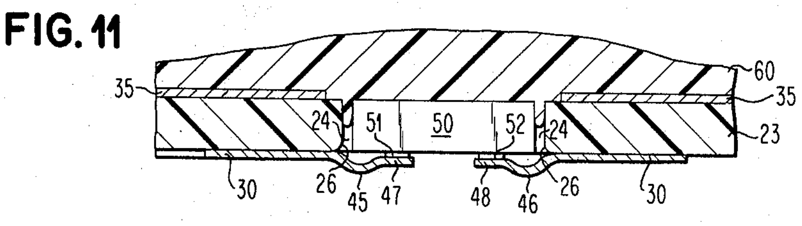

If desired, and as shown in FIGURE 11, the component may be provided with further support to the panel by use of a compliant backing material 60 which may comprise a suitable potting compound and which optionally may be thermally conducting, as for example a dimethyl silicone polymer containing a filler of powdered alumina.

Figure 12:
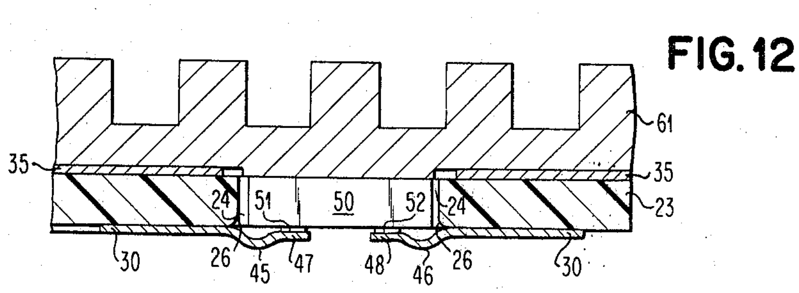

FIGURE 12 illustrates a modification which may be employed with components requiring back-contacting, such as silicon core drivers. In such applications, a conductive disk or heat dissipating member, such as a finned heat sink 61, may be electrically connected by suitable bonding, such as soldering or conductive epoxies, to both the back side of component 50 and to the conductive leads of the circuit 35 provided on the opposite face of panel 23.

Figure 13:
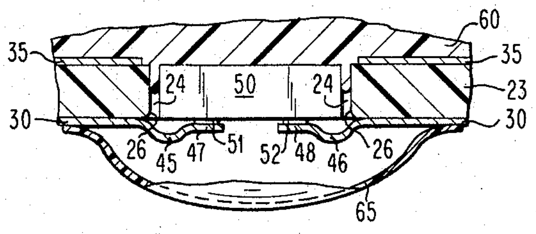
FIGURES 12 to 13 illustrate various modifications of the preceding embodiments.

Also, if desired, as shown in FIGURE 13, the assembly of FIGURE 11 may be provided with a seal in order to provide mechanical protection to the front of the component. In one form, the seal may comprise a non-conductive plastic bubble 65 which may be positioned on the panel to envelop the front of component 50, and then heat sealed or cemented in place.

While the invention has been particularly shown and described with reference to the preferred embodiments thereof, it will be understood by those skilled in the art that the foregoing and other various changes in form and details may be made therein without departing from the spirit and scope of the invention.

What is claimed is:

1. An electrical assembly comprising an electrically non-conducting supporting panel, a component receiving opening through said panel, a pattern of conductive material bonded to a surface of said panel and defining an electrical circuit having a conductive strip projecting over a portion of said hole in cantilever relationship therewith with a portion of said strip intermediate a distal portion thereof and the periphery of said opening having a looped configuration projecting externally away from said surface, and an electrical component disposed in said opening and having a terminal thereof adjacent said surface bonded to said distal portion in electrical conductive relationship therewith.

2. The assembly of claim 1 wherein said circuit includes a second like conductive strip having the configuration of and spaced from the first said strip with the distal portion of said second conductive strip bonded adjacent said surface to a second terminal of said component in electrical conductive relationship therewith.

3. The assembly of claim 2 including a second pattern of conductive material bonded to the opposite surface of said panel and defining a second electrical surface having a conductive portion disposed adjacent said opening, and a conductive member bonded to said opposite surface over said opening and bonded in electrically conductive relation to said conductive portion and to a conductive surface of said component adjacent said opposite surface.

4. The assembly of claim 3 wherein said conductive member comprises a convective heat sink provided with heat transfer fins.

5. The assembly of claim 1 including a heat sink member bonded to the opposite surface of said panel and disposed in heat exchange relationship to the surface of said component adjacent said opposite surface.

6. The assembly of claim 1 including a resilient potting material bonded to portions of the opposite surface of said panel adjacent said opening and over said opening in bonded relationship with the surface of said component adjacent said opposite surface.

7. An electrical assembly comprising an electrically non-conducting panel, a component receiving opening through said panel, a pattern of conductive material bonded to a surface of said panel and defining an electrical circuit having at least two spaced conductive strips projecting over said hole in cantilever relationship therewith with an intermediate portion of said strip interjacent a distal portion thereof and the periphery of said hole having a loop configuration projecting externally away from said surface, and an electrical component disposed in said opening and having at least two terminals thereof disposed adjacent said surface with each of said terminals individually bonded to said distal portion of a said conductive strip in electrically conductive relationship therewith.

8. A method for connecting an electrical component to an electrical circuit bonded as a conductive pattern on a non-conducting supporting panel comprising forming a hole through an electrically non-conductive panel having dimensions adapted to receive a component, forming an adherent pattern of conductive material defining an electrical circuit on a surface of said material with said pattern including at least one conductive strip portion projecting over a portion of said hole, forming an intermediate portion of said strip interjacent a distal portion thereof and the periphery of said holes into a loop projecting externally out of the plane of said panel, inserting said component into said hole with a terminal of said component disposed adjacent said surface, and bonding said terminal to a said distal portion of a said strip in electrically conductive relationship therewith.

9. The method of claim 8 wherein said pattern is formed by coating said surface of said panel with an adherent layer of electrically conductive material selectively removing said layer to retain said material on said surface in a pattern defining said circuit and including said conductive strip portion.

10. The method of claim 8 including forming a second adherent pattern of conductive material defining a second electrical circuit on the opposite surface of said panel, and electrically connecting said second circuit to said component adjacent said opposite surface.

References Cited

UNITED STATES PATENTS

| | | | |
|---|---|---|---|
| 3,011,379 | 12/1961 | Corwin. | |
| 3,345,622 | 10/1967 | Matsushita | 338—316 XR |
| 3,390,308 | 6/1968 | Marley. | |
| 3,248,779 | 5/1966 | Yuska et al. | |
| 3,142,783 | 7/1964 | Warren | 174—68.5 XR |
| 3,192,307 | 6/1965 | Lazar | 174—68.5 |
| 3,287,794 | 11/1966 | Van Hise. | |

FOREIGN PATENTS

| | | |
|---|---|---|
| 1,099,888 | 3/1955 | France. |

DARRELL L. CLAY, Primary Examiner

U.S. Cl. X.R.

29—626, 627; 156—3; 174—68.5; 317—101